US010797115B2

(12) United States Patent
Lee

(10) Patent No.: US 10,797,115 B2
(45) Date of Patent: Oct. 6, 2020

(54) DISPLAY PANEL AND DISPLAY APPARATUS USING THE SAME

(71) Applicant: SAMSUNG ELECTRONICS CO., LTD., Suwon-si (KR)

(72) Inventor: Kye Hoon Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/104,631

(22) Filed: Aug. 17, 2018

(65) Prior Publication Data

US 2019/0058013 A1 Feb. 21, 2019

(30) Foreign Application Priority Data

Aug. 17, 2017 (KR) .................. 10-2017-0104138

(51) Int. Cl.
*H01L 27/32* (2006.01)
*H01L 51/52* (2006.01)

(52) U.S. Cl.
CPC ........ *H01L 27/322* (2013.01); *H01L 51/5268* (2013.01); *H01L 27/3213* (2013.01); *H01L 27/3244* (2013.01); *H01L 2251/5369* (2013.01)

(58) Field of Classification Search
None
See application file for complete search history.

(56) References Cited

U.S. PATENT DOCUMENTS

| 2013/0242228 | A1* | 9/2013 | Park ................. G02F 1/133377 349/61 |
| 2016/0351749 | A1 | 12/2016 | Coe-Sullivan et al. |
| 2017/0125740 | A1 | 5/2017 | Lee et al. |
| 2017/0153366 | A1 | 6/2017 | Park et al. |
| 2017/0153368 | A1 | 6/2017 | Yoon et al. |
| 2017/0186819 | A1 | 6/2017 | Yun et al. |
| 2019/0058013 | A1* | 2/2019 | Lee ..................... H01L 51/5268 |

FOREIGN PATENT DOCUMENTS

KR 10-2016-0000569 A 1/2016
WO WO-2017164475 A1 * 9/2017 ............... G02B 6/00

OTHER PUBLICATIONS

Communication dated Jan. 23, 2019, issued by the European Patent Office in counterpart European Application No. 18186985.0.

* cited by examiner

*Primary Examiner* — David E Graybill
(74) *Attorney, Agent, or Firm* — Sughrue Mion, PLLC

(57) ABSTRACT

The display panel includes a light emitting device, three quantum dot converters including quantum dot particles and converting light of a first color emitted from the light emitting device to light of a different color and emitting the light of the different color, a transmission part transmitting light of the first color emitted from the light emitting device, and a transparent substrate disposed on one side of the three quantum dot converters and the transmission part. One of the three quantum dot converters emits a white light to the transparent substrate.

21 Claims, 9 Drawing Sheets

DISPLAY PANEL AND DISPLAY APPARATUS USING THE SAME

CROSS-REFERENCE TO RELATED APPLICATION(S)

This application is based on and claims priority under 35 U.S.C § 119 to Korean Patent Application No. 10-2017-0104138, filed on Aug. 17, 2017, in the Korean Intellectual Property Office, the disclosure of which is incorporated by reference herein in its entirety.

BACKGROUND

1. Field

The disclosure relates to a display panel and a display apparatus using the same.

2. Description of Related Art

A display apparatus converts acquired or stored electrical information into visual information and displays it to a user, and is used in various fields such as home and business.

A display panel of the display apparatus may be a light emitting display panel that emits light by itself and a non-light emitting display panel that does not emit light by itself. Examples of the light emitting display panel include a Cathode Ray Tube (CRT) panel, an Electro Luminescence (EL) panel, a Light Emitting Diode (LED) panel, an Organic LED (OLED) panel, a Vacuum Fluorescent Display (VFD) panel, a field emission display (FED) panel, and a Plasma Display Panel (PDP), and examples of the non-light emitting display panel include a liquid crystal display (LCD) panel and the like.

The display apparatus include, for example, a television (TV), various audio/video systems, a computer monitor device, a navigation terminal device, and/or various portable terminal devices. For example, the portable terminal device may include a notebook computer device, a smart phone, a personal digital assistant (PDA), and/or a cellular phone. In addition, various apparatuses used in the industrial field and displaying a still image or a moving image are also examples of the display apparatus.

SUMMARY

According to embodiments of the disclosure, there is provided a display panel using an electroluminescent element, and a display apparatus having the display panel, by which light efficiency is improved.

According to embodiments of the disclosure, there is provided a display panel and a display apparatus having the same with improved color reproducibility so as to output an appropriate color screen.

In accordance with an aspect of the disclosure, a display panel includes a light emitting device, three quantum dot converters including quantum dot particles, converting light of a first color emitted from the light emitting device to light of a different color and emitting the light of the different color, a transmission part transmitting light of the first color emitted from the light emitting device, and a transparent substrate disposed on one side of the three quantum dot converters and the transmission part, and one of the three quantum dot converters emits white light to the transparent substrate.

The three quantum dot converters and the transmission part form a unit pixel, and a first quantum dot converter of the three quantum dot converters emits red light, a second quantum dot converter of the three quantum dot converters emits green light, a third quantum dot converter of the three quantum dot converters emits white light, and the transmission part emits blue light.

The light of the first color includes blue light.

The first quantum dot converter includes at least one red quantum dot particle.

The second quantum dot converter includes at least one green quantum dot particle.

The transmission part includes at least one scattering particle distributed within the transmission part and scattering all or some of the light of the first color.

The third quantum dot converter includes at least one yellow quantum dot particle.

White light emitted from the third quantum dot converter is a combination of yellow light emitted from the at least one yellow quantum dot particle and blue light emitted from the light emitting device and transmitted through the third quantum dot converter.

The third quantum dot converter includes at least one red quantum dot particle and at least one green quantum dot particle.

The third quantum dot converter includes a first layer having at least one red quantum dot particle and a second layer having at least one green quantum dot particle.

White light emitted from the third quantum dot converter is a combination of red light emitted from the first layer, green light emitted from the second layer, and blue light emitted from the light emitting device and transmitted through the third quantum dot converter.

The display panel further includes a red color filter disposed between the first quantum dot converter and the transparent substrate and transmitting red light.

The display panel further includes a green color filter disposed between the second quantum dot converter and the transparent substrate and transmitting green light.

The display panel further includes a blue color filter disposed between the transmission part and the transparent substrate and transmitting blue light.

The light emitting device includes a light emitting layer, an anode including a transparent member and disposed on one side of the light emitting layer, a cathode disposed on the other side of the light emitting layer and adapted to reflect light emitted from the light emitting layer toward the anode, a hole transporting layer disposed between the anode and the light emitting layer, an electron injection layer disposed between the cathode and the light emitting layer; and a planarization layer disposed between the transparent substrate and the anode and compensating for a difference in level of the anode.

In accordance with an aspect of the disclosure, a display apparatus includes a light emitting device emitting blue light, a driving circuit configured to drive the light emitting device, a first color adjuster, a second color adjuster and a third color adjuster including quantum dot particles respectively, converting blue light emitted from the light emitting device to light of different colors and emitting the light of different colors, and a fourth color adjuster emitting the blue light emitted from the light emitting device, wherein the first color adjuster includes at least one yellow quantum dot particle, converts some of the blue light emitted from the light emitting device to yellow light and transmits the other of the blue light emitted from the light emitting device.

Light emitted from the first color adjuster is white light including yellow light emitted from the first color adjuster and blue light emitted from the first color adjuster.

The second color adjuster includes red quantum dot particles and converts the blue light emitted from the light emitting device to red light through the red quantum dot particles, and the third color adjuster includes green quantum dot particles and converts the blue light emitted from the light emitting device to green light through the green quantum dot particles.

The first to fourth color adjusters constitute a unit pixel of the display apparatus, and an amount of light emitted from the first color adjuster is greater than a total amount of light emitted from the second color adjuster, third adjuster and the fourth color adjuster when white light is emitted from the unit pixel by the driving circuit.

In accordance with an aspect of the disclosure, a display apparatus includes a light emitting device including a plurality of anodes and a cathode, and a light emitting layer provided between the plurality of anodes and the cathode to generate blue light, a first quantum dot converter including red quantum dot particles and converting blue light generated by the light emitting layer between a first anode of the plurality of anodes and the cathode to red light, a second quantum dot converter including green quantum dot particles and converting blue light generated by the light emitting layer between a second anode of the plurality of the anodes and the cathode to green light, a transmission part including a yellow quantum dot particle and transmitting blue light generated by the light emitting layer between a third anode of the plurality of the anodes and the cathode, and a third quantum dot converter converting some of blue light generated by the light emitting layer between a fourth anode of the plurality of the anodes and the cathode to yellow light and emitting the yellow light, and transmitting the other of the blue light generated by the light emitting layer between the fourth anode of the plurality of the anodes and the cathode, wherein the first quantum dot converter, second quantum dot converter, transmission part, and third quantum dot converter form a unit pixel of the display apparatus.

BRIEF DESCRIPTION OF THE DRAWINGS

These and/or other aspects of the disclosure will become apparent and more readily appreciated from the following description of the embodiments, taken in conjunction with the accompanying drawings, in which.

DETAILED DESCRIPTION

Figure 1:
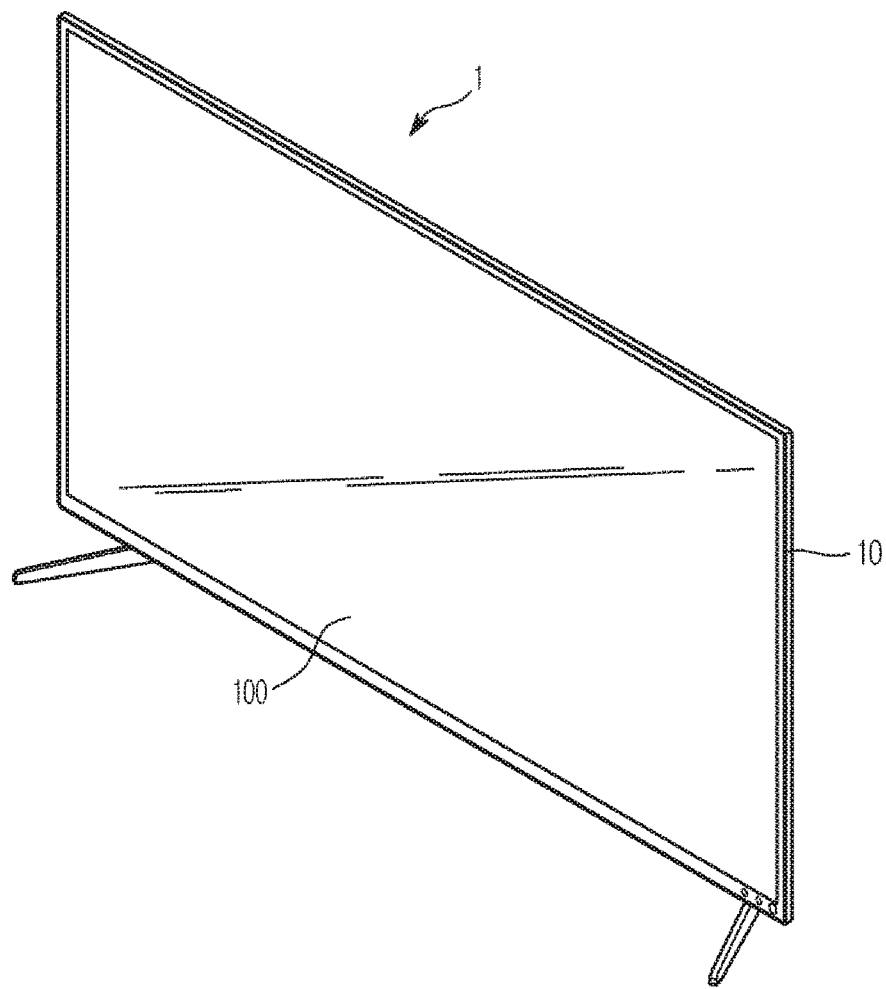
FIG. 1 is a perspective view of a display apparatus in accordance with an embodiment.

Embodiments set forth herein and structures illustrated in the appended drawings are merely examples of the disclosure. Various modifications to the embodiments and the drawings of the disclosure may have been made at the filing date of the present application.

The same reference numbers or signs assigned in the drawings of the disclosure represent components or elements having substantially the same functions.

The terminology used herein is for the purpose of describing particular embodiments only and is not intended to be limiting and/or defining of the disclosure. As used herein, the singular forms "a," "an," and "the" are intended to include the plural forms as well, unless the context clearly indicates otherwise. It should be further understood that the terms "comprise" and/or "comprising," when used in this specification, specify the presence of stated features, integers, steps, operations, elements, components, and/or a combination thereof but do not preclude the presence or addition of one or more other features, integers, steps, operations, elements, components, and/or a combination thereof.

It should be understood that, although the terms "first," "second," etc., may be used herein to describe various components, the components are not limited by these terms. These terms are only used to distinguish one component from another component. For example, a first component discussed below could be termed a second component without departing from the scope of the disclosure. Similarly, a second component discussed below could be termed a first component. The term "and/or" includes any and all combinations of one or more of the associated listed items.

Also, it should be understood that, although the terms "~unit", "~member", "~block", "~module", "~portion" etc., may be used herein to meaning a unit that processes at least one function or operation. However, the meaning of "~unit", "~member", "~block", "~module", "~portion" etc. are not limited to software or hardware, and "~unit", "~member", "~block", "~module", "~portion" etc. may be a configuration stored on a storage medium and executed by one or more processors.

Figure 2:
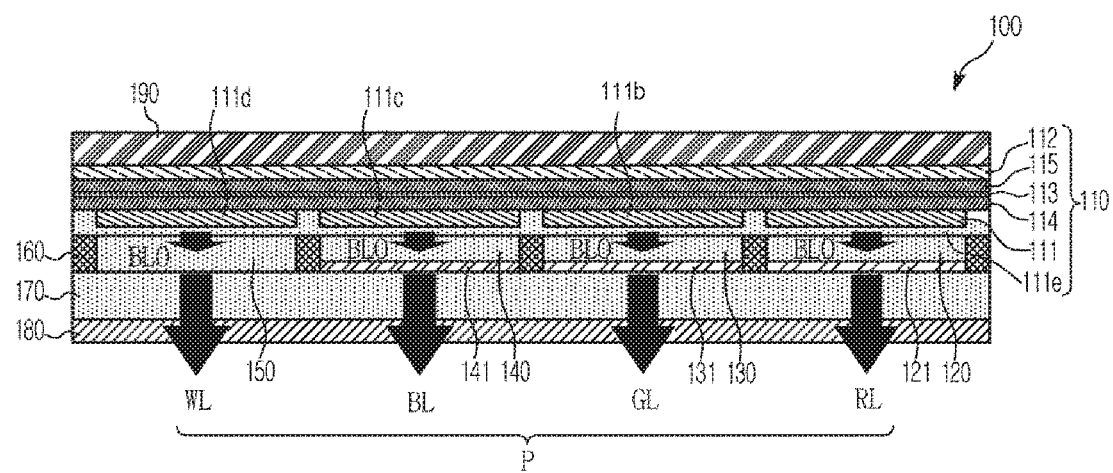
FIG. 2 is a schematic side cross-sectional view of a display panel of a display apparatus in accordance with an embodiment.

FIG. 1 is a perspective view of a display apparatus in accordance with an embodiment, and FIG. 2 is a schematic side cross-sectional view of a display panel of a display apparatus in accordance with an embodiment.

The display apparatus 1 is a device capable of processing a video signal received from the outside and displaying the processed video image. Hereinafter, a TV exemplifies the display apparatus 1, but the disclosure is not limited thereto. For example, the display apparatus 1 may be a monitor, a portable multimedia device, a portable communication device, and the like. The display apparatus 1 is not limited as long as it is a device for visually presenting an image.

Referring to FIGS. 1 and 2, a display apparatus 1 includes a main body 10 forming the exterior of the display apparatus 1 and receiving various components, and a display panel 100 for displaying an image to a user. The driving circuits and electrical components for driving the display panel 100 may be arranged inside the main body 10.

The display panel 100 may display images according to video signals input from the outside of the display apparatus 1. The display panel 100 may be a light emitting display panel that generates images by a plurality of pixels constituting the display panel 100 and emitting light, or may be a non-light emitting display panel in which plurality of pixels reflect/transmit/block light to generate an image.

Hereinafter, the display panel 100 is assumed to be a light emitting display panel that generates light by a light emitting device 110 which is provided inside the display panel 100.

The display panel 100 may generate light by EL. When light is emitted from the light emitting device 110, the image may be displayed outside the display panel 100 through first, second, and third quantum dot converters 120, 130, and 150, e.g., first, second, and third color adjusters, and a transmission part 140.

The light emitting device 110 may include an anode or anodes 111, a cathode 112 and a light emitting layer 113 located between the anode 111 and the cathode 112. A hole transporting layer (HTL) 114 and an electron transporting layer (ETL) 115 may be arranged on the lower side and the upper side, respectively, of the light emitting layer 113. Although not shown in the drawing, a hole injection layer (HIL) may be further arranged between the anode 111 and the HTL 114, and an electron injection layer (EIL) may be interposed between the cathode 112 and the ETL 115.

When a driving circuit applies a driving voltage across the anode 111 and the cathode 112, holes are injected from the anode 111 to the HTL 114, and electrons are transported from the cathode 112 to ETL 115. The holes passing through the HTL 114 and the electrons passing through the ETL 115 are moved to and recombined in the light emitting layer 113. The light emitting layer 113 may emit light while releasing energy during the recombination of electrons and holes.

The anode 111 is an electrode for injecting holes into the light emitting layer 113 as described above, and four anodes, i.e., first, second, third, and fourth anodes 111a, 111b, 111c, and 111d may form one unit pixel P. Each of four anodes, i.e., each of the first, second, third, and fourth anodes 111a, 111b, 111c, and 111d, may form sub-pixels, respectively, that constitute one unit pixel P, and each sub-pixel may generate light having a single color. Each of the first, second, third, and fourth anodes 111a, 111b, 111c, and 111d may be formed of a transparent electrode, and the transparent electrode may be formed of a material such as indium-tin oxide (ITO).

Each of the first, second, third, and fourth anodes 111a, 111b, 111c, and 111d is connected to a thin film transistor (TFT), and each of the first, second, third, and fourth anodes 111a, 111b, 111c, and 111d may receive an electrical signal independently. The TFT has a gate, a source, and a drain, and may be connected to a driving circuit and electrically connected to each of the first, second, third, and fourth anodes 111a, 111b, 111c, and 111d. Accordingly, light may be independently generated from each sub-pixel formed by each of the first, second, third, and fourth anodes 111a, 111b, 111c, and 111d.

The first, second, and third quantum dot converters 120, 130 and 150 and the transmission part 140 are arranged below the first, second, third, and fourth anodes 111a, 111b, 111c, and 111d. A planarization layer 111e formed to have predetermined thickness to compensate differences in level of the first, second, third, and fourth anodes 111a, 111b, 111c, and 111d. Accordingly, light-emitting efficiency of the first, second, and third quantum dot converters 120, 130, and 150 and the transmission part 140 may be increased The planarization layer 111e may be formed of at least one material selected from polyacrylate resins, epoxy resin, phenolic resin, polyimide resin, unsaturated polyesters resin, poly phenylenether resins, polyphenylenesulfide resins, and benzocyclobutene (BCB).

The cathode 112 is the electrode for injecting electrons into the light emitting layer 113 and may be formed of metal to reflect the light generated from the light emitting layer 113 downward. The metal may be silver, aluminum, or the like.

The ETL 115 and the cathode 112 are sequentially stacked from the upper side of the light emitting layer 113, in this order. The HTL 114, the anode 111, and the planarization layer 111e covering the anode 111 are sequentially stacked from the lower side of the light emitting layer 113, in this order.

The light emitting layer 113 may emit blue light. The blue light has some portions thereof inclined towards green light. The light emitting layer 113 may be formed of at least one of an electroluminescent element of a blue quantum dot (QD) system, an electroluminescent element of a blue fluorescent system, an electroluminescent element of a blue thermally activated delayed fluorescent system, and an electroluminescent element of a blue phosphorescent system.

Blue light generated from the light emitting layer 113 may be converted into light having white, red, green, and blue (WRGB) color through the first, second, and third quantum dot converters 120, 130, and 150 and the transmission part 140.

An encapsulation 190 covering and protecting the cathode 112 may be arranged above the cathode 112. The encapsulation 190 may protect the light emitting device 110 and the driving circuit from the outside by sealing them. The encapsulation 190 may be a sealing member that seals a part of the display panel 100 by a sealant, and the sealant used as the sealing member may be formed of various materials such as glass, quartz, ceramic, plastic, and metal. In addition, the encapsulation 190 may prevent deterioration of the cathode 112, thereby improving reliability of the display panel 100.

The first, second, and third quantum dot converters 120, 130, and 150 for changing color of light by changing a wavelength of the light generated from the light emitting layer 113 and the transmission part 140 for transmitting light BL0 generated from the light emitting layer 113 may be disposed below the planarization layer 111e. The first, second, and third quantum dot converters 120, 130 and 150 may convert the color of the light BL0 emitted from the light emitting layer 113 by a quantum dot (QD).

The first, second, and third quantum dot converters 120, 130, and 150 may change color of the incident light BL0 emitted from the light emitting layer 113 and emit light of different colors: red light RL, yellow light YL, and green light GL. For example, the first, second, and third quantum dot converters 120, 130, and 150 may convert blue light BL0 emitted from the light emitting layer 113 into red light RL, green light GL, or yellow light YL, and then emit the light to the outside. In particular, the first, second, and third quantum dot converter 120, 130, and 150 may change the wavelength of the incident light, and emit light having a different color from that of the incident light (wavelength shift).

A glass substrate 170 formed with a transparent material may be disposed in a direction opposite to the direction in which the light is incident on the first, second, and third quantum dot converters 120, 130 and 150 and the transmission part 140. Light passing through the first, second, and third quantum dot converters 120, 130, and 150 and the transmission part 140 may be externally displayed on the glass substrate 170. An external light blocking part 180 may be provided on the glass substrate 170 to reflect external light.

The quantum dot refers to semiconductor crystals formed by aggregation of hundreds to thousands of atoms. The size of the quantum dot may be in a range from several nanometers to tens of nanometers. Thus, the quantum dot causes a quantum confinement effect because it is in a very small size. In the quantum confinement effect, electrons in a very small particle form a discrete energy state by an outer surface of the particle, in which case the smaller the space in the particle, the higher the energy state of electrons and the wider the energy bandgap. According to the above quantum dot confinement effect, when light such as ultraviolet light, visible light, and/or the like is incident on the quantum dot, the quantum dot may generate light having a wide range of wavelengths. The quantum dot disperses and emits the incident light.

The length of a wavelength of light generated from the quantum dot may depend on the size of the particle. In particular, when light of a wavelength having greater energy than the bandgap energy is incident onto the quantum dot, the quantum dot absorbs energy of the light and is excited, then emits light of a particular wavelength, and is thus put into a ground state. In this case, when the size of the quantum dot is small, light having a relatively short wavelength such as blue-based light or green-based light may be generated, and when the size of the quantum dot is large, light having a relatively long wavelength such as red-based light may be generated. Thus, light of various colors may be realized based on the size of the quantum dot.

Hereinafter, a quantum dot particle capable of emitting green-based light in response to an incident light is referred to as a green light quantum dot particle or green light quantum dot particles 132, i.e., green light-emitting quantum dot particles, a quantum dot particle capable of emitting red-based light in response to an incident light is referred to as a red light quantum dot particle or red light quantum dot particles 122, i.e., red light-emitting quantum dot particles, and a quantum dot particle capable of emitting yellow-based light in response to an incident light is referred to as a yellow light quantum dot particle or yellow light quantum dot particles 152, i.e., yellow light-emitting quantum dot particles. The green light quantum dot particle 132 may be a particle having a width in a range of about 2 nm to about 3 nm, the red light quantum dot particle 122 may be a particle having a width in a range of about 5 nm to about 6 nm, and the yellow light quantum dot particle 152 may be a particle having a width in a range of about 3 nm to about 4 nm.

The first, second, and third quantum dot converters 120, 130, and 150 may include a plurality of quantum dots, and the plurality of quantum dots may emit light of various colors based on the size of the quantum dot. Thus, the first, second, and third quantum dot converters 120, 130, and 150 may convert incident light using the quantum dot, and emit light of different colors.

In the related art electroluminescent device panel, especially, in an electroluminescent device panel using an OLED, white light generated from the light emitting layer is converted into WRGB colors through color filters disposed under the anode, thereby forming a pixel.

One pixel may be composed of sub-pixels forming white, red, green, and blue light, and a transparent layer, a red color filter, a green color filter, and a blue color filter are disposed for the sub-pixels. That is, the WRGB colors may be implemented through the color filters disposed in the sub-pixels.

Since each of the color filters transmits a wavelength of the light corresponding to the corresponding color and absorbs the other wavelengths, light emitting efficiency is reduced. Specifically, for the white light generated from the light emitting device, the red color filter transmits light having a wavelength (between approximately 620 nm and 740 nm) forming the red color and absorbs light having other wavelengths, and the green color filter transmits light having a wavelength (between approximately 520 nm and 550 nm) and absorbs light having other wavelengths, and the blue color filter transmits light having a wavelength (approximately 435 nm to 500 nm) and absorbs light having other wavelengths. Therefore, the light emitting efficiency is reduced by about 70%.

To prevent this, the display panel 100 of the display apparatus according to an embodiment uses the first, second, and third quantum dot converters 120, 130 and 150 rather than the color filters to convert the wavelength of the blue light BL0 generated from the light emitting layer 113, so that the process of absorbing light in the color filter may be omitted. Therefore, each sub-pixel changes the wavelength of light generated from the light emitting layer 113 without absorbing the light, thereby preventing a decrease in the efficiency of the display panel 100.

The first, second, and third quantum dot converters 120, 130, and 150 may be disposed below the anode 111. The plurality of anodes 111 form the unit pixel P as described above, and the plurality of anodes 111 may be defined as a first anode 111*a*, a second anode 111*b*, a third anode 111*c*, and a fourth anode 111*d*.

The first quantum dot converter 120 may be provided on the first anode 111*a* and the second quantum dot converter 130 may be provided on the second anode 111*b*. The transmission part 140 may be provided on the third anode 111*c* and the third quantum dot converter 150 may be provided on the fourth anode 111*d*.

That is, the first, second, and third quantum dot converters 120, 130, and 150 are disposed to correspond to the first, second, and fourth anodes 111*a*, 111*b*, and 111*d* on a unit pixel P, e.g., one pixel of the display panel that is formed by the first, second, third, and fourth anodes 111*a*, 111*b*, 111*c*, and 111*d*, and the transmission part 140 may be disposed to correspond to the third anode 113*c* on the unit pixel P.

A blocking matrix 160 is disposed between each of the first, second, and third quantum dot converters 120, 130 and 150 and the transmission part 140 to separate the first, second, and third quantum dot converters 120, 130 and 150 and the transmission part 140 from one another. This may prevent interference between the first, second, and third quantum dot converters 120, 130, and 150 and the transmission part.

Figure 3:
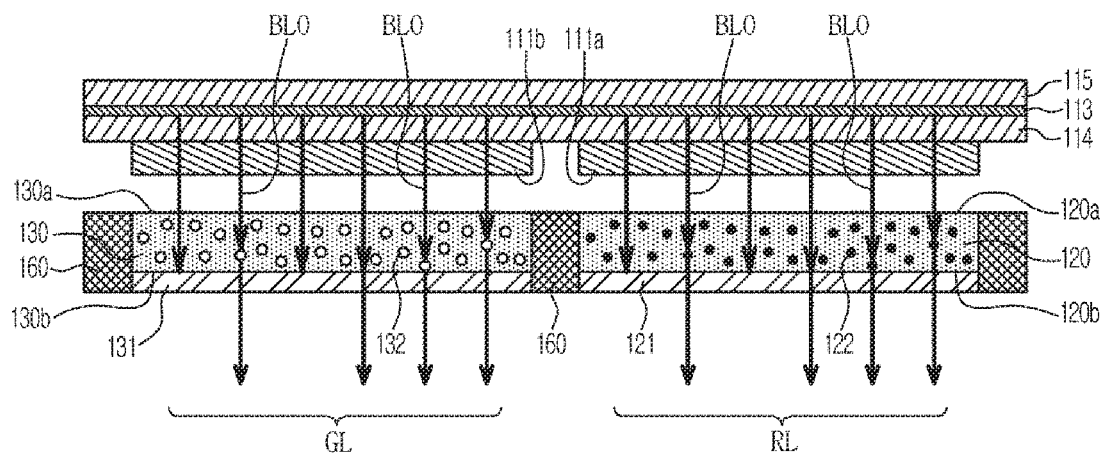
FIG. 3 is a view for explaining a part of a configuration of a first quantum dot converter, a second quantum dot converter and a display panel of a display apparatus in accordance with an embodiment.

As illustrated in FIG. 3, the first quantum dot converter 120 corresponding to the first anode 111*a* may be a red light quantum dot converter for converting the blue light BL0 generated from the light emitting layer 113 into red light RL. Specifically, the first quantum dot converter 120 including the red light quantum dot particles 122 converts the blue light BL0 into red light RL to emit the red light RL toward the glass substrate 170.

The second quantum dot converter 130 corresponding to the second anode 111*b* may be a green light quantum dot converter for converting the blue light BL0 generated from the light emitting layer 113 into green light GL. Specifically, the second quantum dot converter 130 including the green light quantum dot particles 132 converts the blue light BL0 into green light GL to emit the green light GL toward the glass substrate 170.

The red light quantum dot particles 122 emit red light RL. The size of the red light quantum dot particle 122 is relatively larger than the size of the green light quantum dot particle 132.

The green light quantum dot particles 132 emit green light GL having a longer wavelength than the incident blue light BL0. The first quantum dot converter 120 including the red light quantum dot particles 122 and the second quantum dot converter 130 including the green light quantum dot particles 132 may have the form of a thin plate having a predetermined thickness, and may be disposed in a predefined pattern.

The first and second quantum dot converters 120 and 130 may respectively include first surfaces 120a and 130a on which the blue light BL0 emitted from the light emitting layer 113 is incident, and second surfaces 120b and 130b from which the color-converted light RL, GL is emitted. The first surfaces 120a and 130a are located in a direction in which the light emitting layer 113 is located and the second surfaces 120b and 130b are located in a direction opposite to the light emitting layer 113.

Accordingly, the blue light BL0 may be incident on the first surface 120a of the first quantum dot converter 120 and the converted red light RL may be emitted from the second surface 120b of the first quantum dot converter 120. Similarly, the blue light BL0 may be incident on the first surface 130a of the second quantum dot converter 130 and the green light GL may be emitted from the second surface 130b of the second quantum dot converter 130.

A first color filter 121 and a second color filter 131 may be disposed on the second surface 120b of the first quantum dot converter 120 and the second surface 130b of the second quantum dot converter 130, respectively. The light BL0 generated from the light emitting layer 113 passes through the first and second quantum dot converters 120 and 130, in which case some of the light BL0 may pass through the first and second quantum dot converters 120 and 130 without being absorbed by the red light quantum dot particles 122 or the green light quantum dot particles 132 disposed on the first and second quantum dot converters 120 and 130, respectively, and thus, without having their wavelengths changed.

Accordingly, some of the light RL, GR emitted from the first and second quantum dot converters 120 and 130 may have blue color, which is an intrinsic color of the light BL0 emitted from the light emitting layer 113, causing a problem that the color reproduction performance of the red sub-pixel and the green sub-pixel is deteriorated. In order to prevent this, first and second color filters 121 and 131 for correcting the color reproduction performance are disposed in the first, second, and third quantum dot converters 120 and 130, respectively, to absorb the light transmitted with the wavelength unchanged, so that the color reproduction performance may be improved.

The first color filter 121 may be provided as a red color filter that transmits the red light RL but absorbs the blue light BL0 that is present with the red light emitted. Therefore, the first color filter 121 may transmit light having a wavelength of approximately 620 nm to 740 nm and absorb light having the other wavelengths. Since the wavelength of the blue light BL0 is approximately 500 nm or less, the blue light BL0 passing through the first quantum dot converter 120 is absorbed by the first color filter 121, and finally, the red light RL is incident on the glass substrate 170.

However, the first color filter 121 is not limited to the red color filter, and may be configured to transmit even yellow light. The first color filter 121 may be configured to transmit the wavelength region of the red light RL and also the light of the wavelength of about 560 nm to 740 nm, to transmit yellow light. This is because the light passing through the first quantum dot converter 120 is the mixture of the red light RL converted by the red light quantum dot particle 122 and the blue light BL0 generated by the light emitting layer 113, and yellow light is not emitted from the red sub-pixel even if the yellow color filter is replaced with a red color filter.

Likewise, the second color filter 131 may be provided as a green color filter that transmits the green light GL but absorbs the blue light BL0 which is present with the green light GL emitted. Therefore, the second color filter 131 may transmit light having a wavelength of approximately 520 nm to 550 nm and absorb light having the other wavelengths. Since the wavelength of blue light BL0 is approximately 500 nm or less, the blue light BL0 passing through the second quantum dot converter 130 is absorbed by the second color filter 131 and finally, the green light GL is incident on the glass substrate.

There is no problem of reduction in the efficiency of the light generated from each sub-pixel as in the related art display apparatus, even though blue light BL0 is absorbed by the first and second color filters 121 and 131, since most of light generated from each sub-pixel is red light RL or green light GL and the other light which is present is the blue light BL0.

Figure 4:
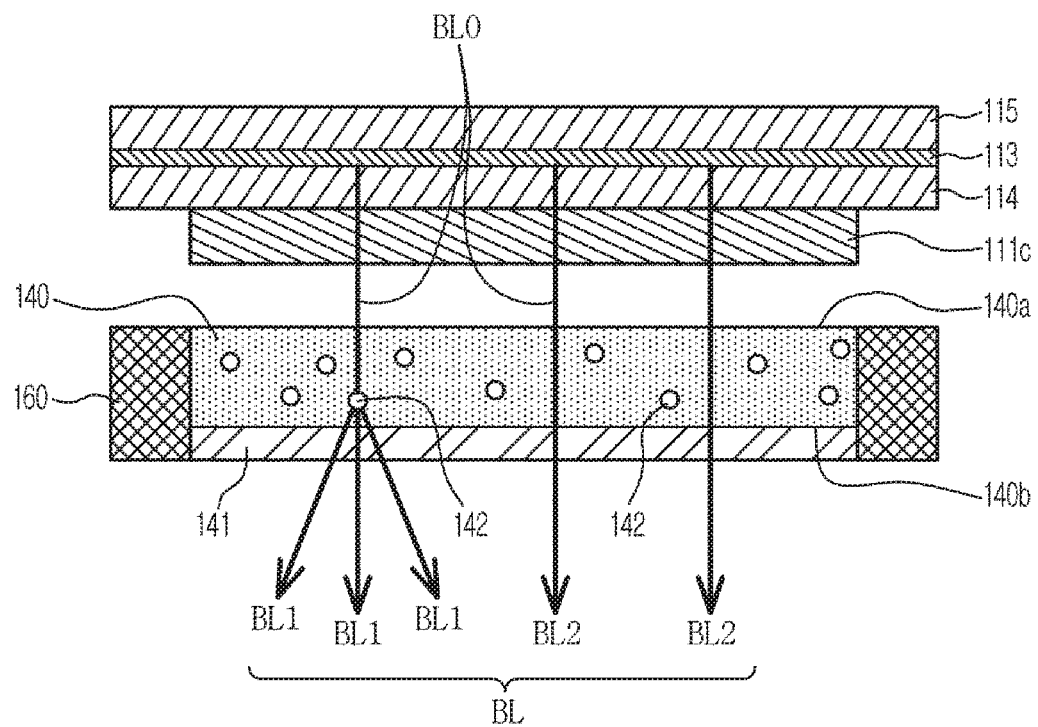
FIG. 4 is a view for explaining a part of a configuration of a transmission part and a display panel of a display apparatus in accordance with an embodiment.

As illustrated in FIG. 4, the transmission part 140 corresponding to the third anode 111c transmits the blue light BL0 generated from the light emitting layer 113 as is, without change, to the glass substrate 170.

The transmission part 140 transmits the light BL0 incident from the light emitting layer 113 and emits it in a direction opposite to the incidence direction. The transmission part 140 may allow some of the incident light BL0 to pass through (BL2) or scatter (BL1). Therefore, the light transmitted through the transmission part 140 may be blue light BL as a whole.

The transmission part 140 may be in the form of a thin plate having predetermined thickness in the same manner as the first quantum dot converter 120 and the second quantum dot converter 130. Light may be incident on a first surface 140a of the transmission part 140 and be emitted from the second surface 140b of the transmission part 140. The transmission part 140 may include one or more scattering particles 142 scattered within the transmission part 140.

The transmission part 140 is formed of a light transmissive material capable of transmitting all or some of the incident light. The light transmitting material may include a material having transparency of a certain level or higher such as resin, e.g., natural resin or synthetic resin, glass, or the like. The synthetic resin may include an epoxy resin, a urethane resin or polymethyl methacrylate (PMMA), and the glass may include a silicate glass, a borate glass, a phosphate glass, or the like. In addition, a material capable of transmitting various kinds of light may be used as a light transmitting material.

Some of the light BL0 incident on the transmission part 140 may be transmitted through the transmission part 140 without being scattered by the scattering particles 142 and emitted through the second surface 140b of the transmission part 140 without change in direction (BL2). Also, the other light BL0 incident on the transmission part 140 may be emitted after being scattered by the scattering particles 142 (BL1).

The scattering particles 142 are randomly distributed in the transmission part 140 or in a predefined pattern, and may scatter the incident light within a certain range. For example, the scattering particles 142 may scatter incident blue light BL0. Some of the incident blue light BL0 is emitted by contacting and being scattered by the scattering particles 142. Accordingly, some of the light BL0 incident on the transmission part 140 is transmitted through the transmission part 140 while being spread within a certain range (BL1).

According to an embodiment, at least one of zinc oxide, titanium oxide, and silicon oxide may be used as the scattering particles 142. In addition, various kinds of particles capable of scattering incident light may be used as the above-described scattering particles.

Since some of the incident light BL0 is emitted by being scattered by the scattering particles 142 (BL1), the blue light BL that has passed through the transmission part 140 may be emitted while being spread in the same or approximate range to the light RL, GL emitted from the second and third quantum dot converters 130 and 150.

In the case that the blue light BL0 is transmitted through the transmission part 140, the incident blue light BL0 is spread out as compared with the case where the scattering particles 142 are not present, and the blue light BL may be emitted in a front direction and also in an oblique direction with respect to the glass substrate 170. A range in which the blue light BL1 is scattered may be different depending on the type of the scattering particles 142 or the like. As the blue light BL1 is scattered by the scattering particles 142, it is possible to solve the problem of a lack of color viewing angle, which may be caused by narrower spreading of the blue light BL than that of other colors.

Since the blue sub-pixel formed by the transmission part 140, unlike the first quantum dot converter 120 or the second quantum dot converter 130, directly transmits blue light BL0 from the light emitting layer 113 to the glass substrate 170 without conversion, the color reproducibility is not lowered.

Therefore, even if the color filter is not disposed on the other side of the first quantum dot converter 120 or the second quantum dot converter 130, the color reproducibility is not lowered. However, light RL, GL, YL converted by the first quantum dot converter 120, the second quantum dot converter 130, or the third quantum dot converter 150 adjacent to the transmission part 140 may move into the transmission part 140 through reflection.

In order to prevent this, the third color filter 141 may be disposed on the other side of the transmission part 140. The third color filter 141 is a blue color filter that transmits blue light BL, and may transmit blue light BL having a wavelength of approximately 435 nm to 500 nm.

Since the majority of light BL transmitted through the transmission part 140 is formed of blue light as described above, even if the third color filter 141 is disposed on the second surface 140b of the transmission part 140, it does not reduce efficiency of light.

Figure 5:
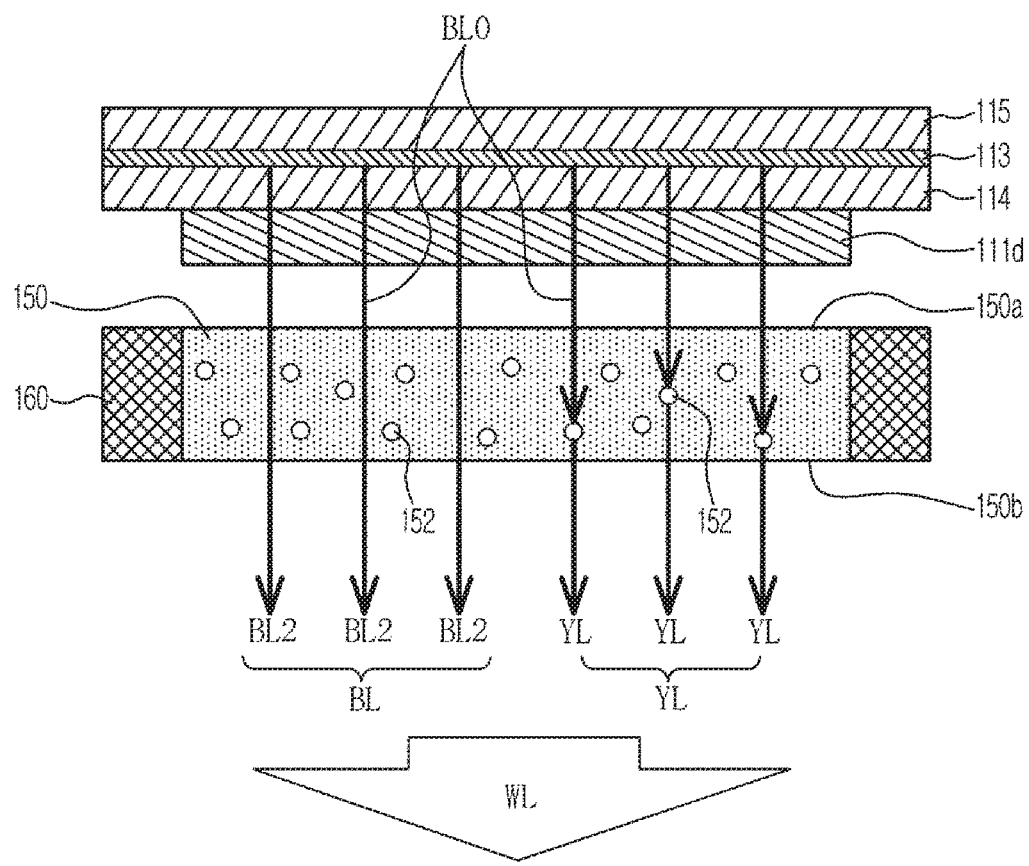
FIG. 5 is a view for explaining a part of the configuration of a third quantum dot converter and a display panel of a display apparatus in accordance with an embodiment.

As illustrated in FIG. 5 the third quantum dot converter 150 corresponding to the fourth anode 111d is a yellow color quantum dot converter for converting blue light BL0 generated from the light emitting layer 113 into yellow light YL. Specifically, the third quantum dot converter 150 converts blue light BL0 incident on the yellow light quantum dot particles 152 into yellow light YL to emit the yellow light YL toward the glass substrate 170.

As described above, the yellow light quantum dot particles 152 emit yellow light YL. The yellow light quantum dot particles 152 may be substantially defined to have a hue between greenish yellow and yellow, and the yellow light quantum dot particles 152 may emit yellow light YL having a wavelength longer than the wavelength of the incident blue light BL0. A plurality of yellow light quantum dot particles 152 are disposed inside the third quantum dot converter 150 and the size of the yellow light quantum dot particle 152 is relatively larger than the size of the green light quantum dot particle 132 but smaller than the size of the red light quantum dot particle 122.

The third quantum dot converter 150 may have the form of a thin plate having a predetermined thickness, and may be arranged on a substrate randomly or in a predefined pattern.

The third quantum dot converter 150 includes the first surface 150a on which the blue light BL0 emitted from the light emitting layer 113 is incident and the second surface 150b from which the color-converted light YL and non-converted blue light BL is emitted. The first surface 150a is in the direction in which the light emitting layer 113 is located and the second surface 150b is located in the opposite direction of the light emitting layer 113. The blue light BL0 is incident on the first surface 150a of the third quantum dot converter 150, and the non-converted blue light BL and the converted yellow light YL is emitted from the second surface 150b. For example, a portion of a totality of the blue light BL0 that is incident on the third quantum dot converter 150 is converted to a yellow light YL and a remaining portion of the totality of the blue light BL0 that is incident on the third quantum dot converter 150 is transmitted as blue light BL2 without being converted to a yellow light YL, by passing in-between the yellow light quantum dot particles 152. White light WL may be finally emitted by the combination of light YL and blue light BL.

In the third quantum dot converter 150, yellow light quantum dot particles 152 are distributed randomly or in a predefined pattern. The fact that the white light WL is emitted from the second surface 150b of the third quantum dot converter 150 implies that both the blue light BL and the yellow light YL are substantially emitted by the third quantum dot converter 150. The white light WL may be finally emitted from the third quantum dot converter 150 by the combination of the blue and yellow colors of light BL and YL.

Blue light BL emitted from the second surface 150b of the third quantum dot converter 150 corresponds to the blue light BL0 generated by the light emitting layer 113, which has passed through the third quantum dot converter 150 without being absorbed by the yellow light quantum dot particles 152 and keeps the wavelength unchanged.

The yellow light YL emitted from the second surface 150b of the third quantum dot converter 150 results from conversion of the blue light BL0 emitted from the light emitting layer 113 into the yellow light YL by the yellow light quantum dot particles 152 arranged inside the third quantum dot converter 150.

As described above, white light WL emitted from the second surface 150b of the third quantum dot converter 150 is made by combination of the blue light BL and yellow light YL emitted from the second surface 150b of the third quantum dot converter 150. To have substantially the same amount of colors of light YL and BL pass through the third quantum dot converter 150, the yellow light quantum dot particles 152 in the third quantum dot converter 150 may be arranged at a lower density than the red light quantum dot particles 122 of the first quantum dot converter 120 or the green light quantum dot particles 132 of the second quantum dot converter 130.

This is because a certain amount of blue light BL0 should pass through the second surface 150b of the third quantum dot converter 150 without being absorbed by the yellow light quantum dot particles 152 in the third quantum dot converter 150.

In the related art display panel, to create white light by converting light emitted from a light source into RGB color using a related art quantum dot converter, the unit pixel includes three sub-pixels emitting red light, green light, and blue light. The white light of the unit pixel is formed by combination of red light, green light, and blue light of the sub-pixels.

When a white image is displayed on the display panel, white light may be emitted from a plurality of unit pixels to display the white image. The white light emitted from each unit pixel may be a mixture of three different wavelengths of light.

The red light, green light, and blue light may be emitted in substantially the same size from the sub-pixels to emit the white light from the unit pixel, but the white light generated from the respective unit pixels may be emitted unevenly due to some reasons, such as differences in time taken to emit the same quantity of red, green, and blue colors of light. Accordingly, a white area displayed on the display panel may be perceived by the user as if the display area contains stains.

In order to prevent this, the unit pixel of the display panel of the display apparatus according to an embodiment includes red, green, blue, and white sub-pixels (the first quantum dot converter 120 having red light quantum dot particles, the second quantum dot converter 130 having green light quantum dot particles, the transmission part 140, and the third quantum dot converter 150 having yellow light quantum dot particles). Accordingly, uniformity of the white light WL in the white region displayed on the display apparatus 1 may be improved.

Specifically, white light WL is emitted from a plurality of unit pixels corresponding to a white area. The third quantum dot converter 150 is configured to emit most of the white light emitted from each unit pixel P while it is less likely to create white light by combination of the red light RL, the green light GL and the blue light BL, so that the non-uniformity of white light between the unit pixels P, which occurs in the related art display apparatus may be reduced.

Further, the yellow light YL formed by the third quantum dot converter 150 is converted in wavelength by the yellow light quantum dot particles 152 of the third quantum dot converter 150. The wavelength of the yellow light YL converted by the yellow light quantum dot particles 152 is in between approximately 550 nm and 600 nm. White light WL formed by the yellow light YL of about 550 nm to about 600 nm of wavelength and the blue light BL is higher in visibility than the white light formed by mixing the red light, green light and blue light.

The luminosity function represents the average spectral sensitivity of the visual perception of the user (human), which is a measure of relative sensitivity of light of different wavelengths, in which case light of a wavelength having a particular value may be perceived brighter by the user than that having some other particular value.

Specifically, light having a wavelength of about 570 nm may be perceived by a user to be brighter than light having the other wavelengths, so that the light having the wavelength of about 570 nm has a higher sensitivity to a user than the other wavelengths of light, thereby having increased visibility.

The light YL converted by the above-described yellow light quantum dot particles 152 has the wavelength of approximately 550 nm to 600 nm, which includes 570 nm which gives the maximum sensitivity in the luminous intensity function, and may thus be perceived to be brighter by the user than the other light. Therefore, the white light WL formed by the yellow light YL converted by the yellow light quantum dot particles 152 and the blue light BL has better visibility than that emitted from the related art display apparatus that displays white light WL formed by the blue light, red light (having a wavelength of approximately 625 nm to 740 nm), and green light (having a wavelength of approximately 520 nm and 550 nm).

Figure 6:
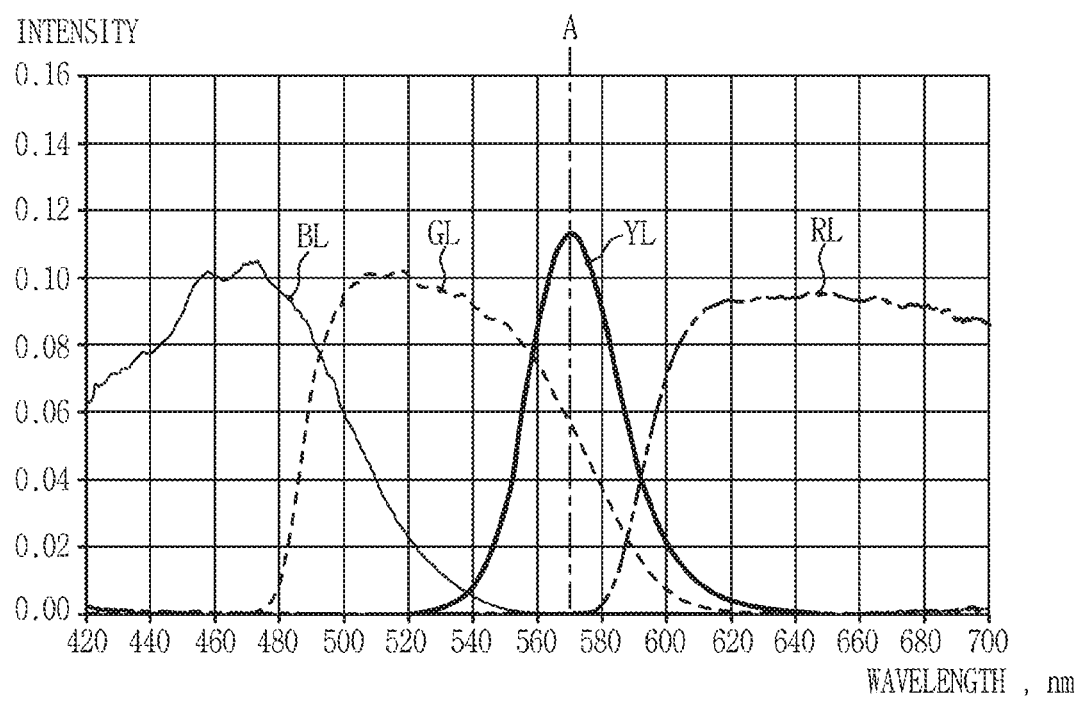
FIG. 6 is a graph showing the relationship between the intensity of light and the wavelength of light.

FIG. 6 provides graphs for each color of light showing the relationships between the intensity of light and the wavelength of light.

Figure 7:
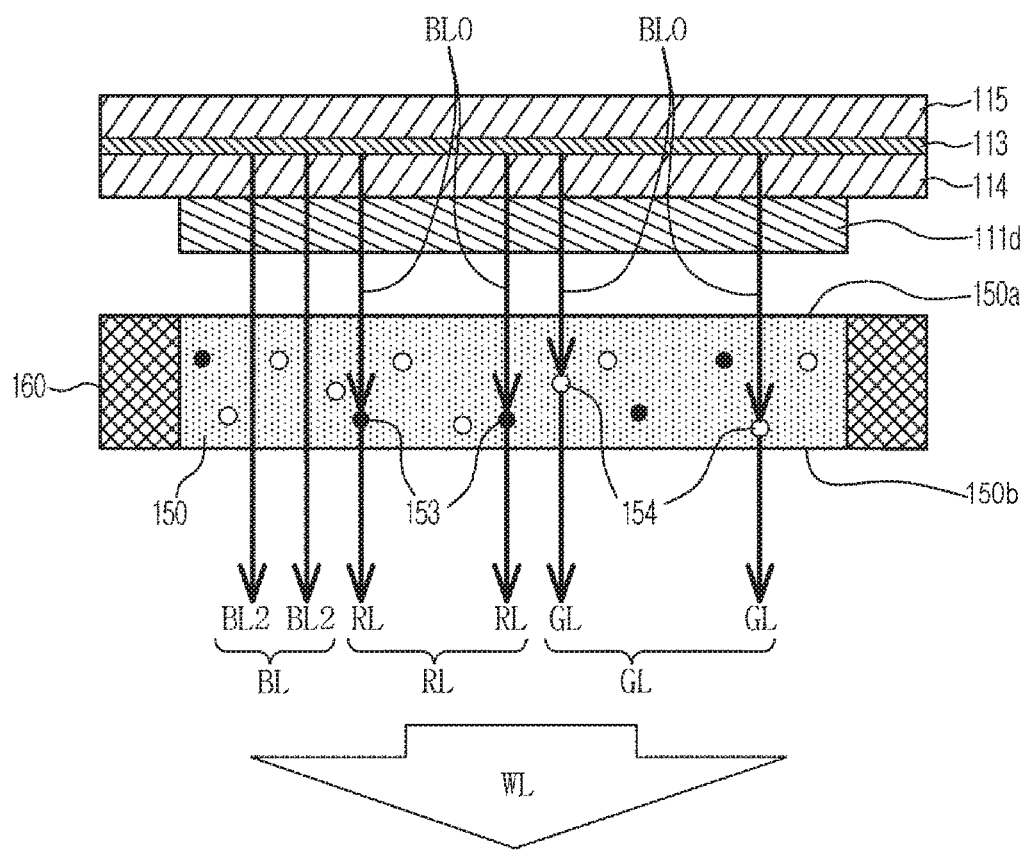
FIG. 7 is a view for explaining a part of a configuration of a third quantum dot conversion unit and a display panel of a display apparatus in accordance with an embodiment.

As illustrated in FIG. 7, the third quantum dot converter 150 corresponding to the fourth anode 111d converts the blue light BL0 generated from the light emitting layer 113 into the red light RL and the green light GL. Specifically, the third quantum dot converter 150 which includes red light quantum dot particles 153 and green light quantum dot particles 154 converts the blue light BL0 into white light WL, and emits the white light WL to the glass substrate 170.

As described above, the red light quantum dot particles 153 emit red light RL and the green light quantum dot particles 154 emit green light GL having a wavelength longer than that of the incident blue light BL. A plurality of red light quantum dot particles 153 and a plurality of green light quantum dot particles 154 are disposed inside the third quantum dot converter 150, and the size of the red light quantum dot particles 153 is relatively larger than the size of the green light quantum dot particles 154.

The third quantum dot converter 150 includes a first surface 150a on which the blue light BL0 emitted from the light emitting layer 113 is incident and the second surface 150b from which the converted color of light GL and RL and non-converted color of light BL0 is emitted. The first surface 150a is located in the direction in which the light emitting layer 113 is located and the second surface 150b is located in the direction opposite to the light emitting layer 113. The blue light BL0 is incident on the first surface 150a of the third quantum dot converter 150 and the converted red light RL, green light GL and the non-converted blue light BL2 may be emitted from the second surface 150b.

The red light quantum dot particles 153 and green light quantum dot particles 154 may be distributed in the third quantum dot converter 150 randomly or in a predetermined pattern, and may be in equal shares.

As described above, the white light WL is emitted from the second surface 150b of the third quantum dot converter 150, and, thus, the third quantum dot converter 150 may substantially emit all of the blue light BL, red light RL and the green light GL. The white light WL may be finally emitted from the third quantum dot converter 150 by combination of the three colors of light RL, GL and BL.

The blue light BL emitted from the second surface 150b of the third quantum dot converter 150 corresponds to the blue light BL0 generated by the light emitting layer 113, which has passed the third quantum dot converter 150 without being absorbed by any of the red light quantum dot particles 153 and the green light quantum dot particles 154 and keeps the wavelength unchanged.

The red light RL emitted from the second surface 150b of the third quantum dot converter 150 results from conversion of the blue light BL0 emitted from the light emitting layer 113 into the red light RL by the red light quantum dot particles 153 arranged inside the third quantum dot converter 150.

The green light GL emitted from the second surface 150b of the third quantum dot converter 150 results from conversion of the blue light BL0 emitted from the light emitting layer 113 into the green light GL by the green light quantum dot particles 154 arranged inside the third quantum dot converter 150.

As described above, white light WL emitted from the second surface 150b of the third quantum dot converter 150 is made by combination of the blue light BL, red light RL, and green light GL emitted from the second surface 150b of the third quantum dot converter 150. To have substantially the same amount of colors of light BL, RL, and GL pass through the third quantum dot converter 150, the red and green light quantum dot particles 153 and 154 in the third quantum dot converter 150 may be arranged at a lower density than the red light quantum dot particles 122 of the first quantum dot converter 120 or the green light quantum dot particles 132 of the second quantum dot converter 130.

This is because a certain amount of blue light BL0 should pass through the second surface 150b of the third quantum dot converter 150 without being absorbed by the red or green light quantum dot particles 153 or 154 in the third quantum dot converter 150.

Figure 8:
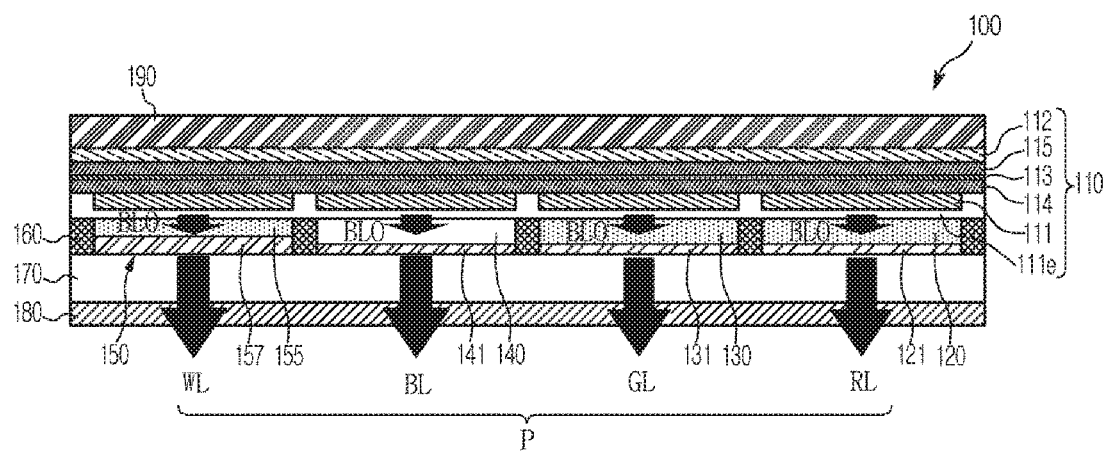
FIG. 8 is a schematic side cross-sectional view of a display panel of a display apparatus in accordance with an embodiment.

As illustrated in FIG. 8, the third quantum dot converter 150 in an embodiment may include first and second layers 155 and 157 that overlap in a vertical direction, e.g., in a direction in which the layers of the display panel 100 are stacked. A first layer 155 may be disposed adjacent to the fourth anode 111d and a second layer 157 may be disposed below the first layer 155.

Figure 9:
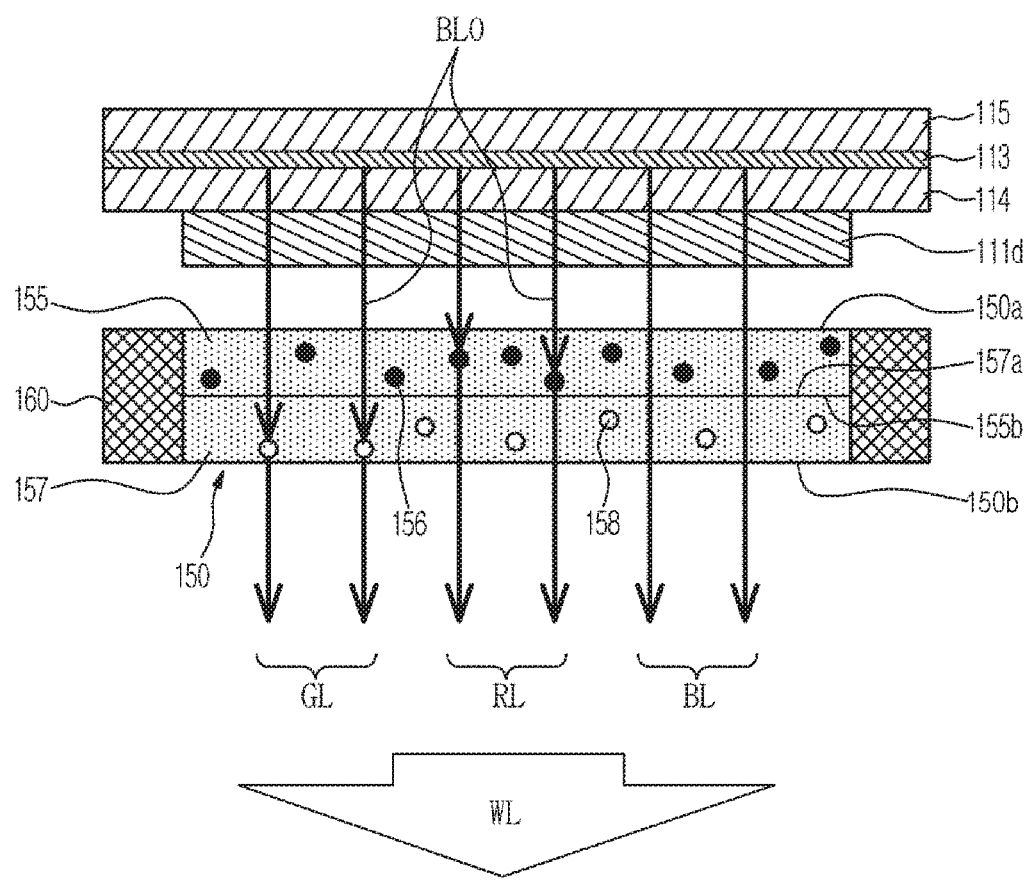
FIG. 9 is a view for explaining a part of the configuration of a third quantum dot converter and a display panel of a display apparatus in accordance with an embodiment.

As illustrated in FIG. 9, the first layer 155 may be a red light quantum dot converter that converts blue light BL0 generated from the light emitting layer 113 into red light RL. Specifically, the first layer 155 includes the red light quantum dot particles 156 for converting the incident blue light BL0 into red light RL and emitting the red light RL toward the second layer 157.

The second layer 157 may be a green light quantum dot converter that converts blue light BL0 generated from the light emitting layer 113 into green light GL. Specifically, the second layer 157 includes the green light quantum dot particles 158 for converting the incident blue light BL0 into the green light GL and emitting the green light GL toward the glass substrate 170.

The first layer 155 includes the first surface 150a on which the blue light BL0 emitted from the light emitting layer 113 is incident and the second surface 155b through which the color-converted light RL is emitted or the non-converted blue light BL is transmitted. The first surface 150a is located in the direction in which the light emitting layer 113 is located and the second surface 155b is located in the direction opposite to the light emitting layer 113.

The second layer 157 includes a first surface 157a on which the blue light BL and the red light RL emitted from the second surface 155b of the first layer 155 are incident, and the second surface 150b through which the color-converted green light GL is transmitted or the blue light GL or red light GL is transmitted without conversion. The first surface 157a of the second layer 157 is located in the direction in which the second surface 155b of the first layer 155 is positioned and the second surface 150b of the second layer 157 is located in the direction opposite to the light emitting layer 113.

The first layer 155 including the red light quantum dot particles 156 and the second layer 157 including the green light quantum dot particles 158 may have the form of a thin plate of predetermined thickness, and are arranged on a substrate randomly or in a predefined pattern.

Accordingly, the third quantum dot converter 150 includes one side 150a of the first layer 155 onto which the blue light BL0 emitted from the light emitting layer 113 in incident and the second surface 150b of the second layer 157 through which the white light WL formed by the green light GL and the blue light BL is emitted.

The blue light BL, the red light RL and the green light GL may all be emitted from the second surface 150b of the second layer 157. A combination of the three lights BL, RL and GL forms the white light WL, and the white light WL may be finally emitted from the third quantum dot converter 150.

The blue light BL emitted from the third quantum dot converter 150 corresponds to the blue light BL0 generated by the light emitting layer 113 that has passed the third quantum dot converter 150 without being absorbed by any of the red light quantum dot particle 156 of the first layer 155 and the green light quantum dot particles 158 of the second layer 157 and keeps the wavelength unchanged.

The red light RL emitted from the third quantum dot converter 150 results from conversion of the blue light BL0 emitted from the light emitting layer 113 to red light RL by the red light quantum dot particles 156 arranged in the first layer 155, the red light RL transmitted through the second layer 157 without being changed by the green light quantum dot particles 158 in the second layer 157.

The green light GL emitted from the third quantum dot converter 150 results from conversion of the blue light BL0 emitted from the light emitting layer 113 to green light GL by the green light quantum dot particles 158 arranged in the second layer 157.

As described above, white light WL emitted from the third quantum dot converter 150 is made by the blue light BL, red light RL, and green light BL emitted from the second surface 150b of the third quantum dot converter 150. To have substantially the same amount of colors of light BL, RL, and GL pass through the third quantum dot converter 150, the red light quantum dot particles 156 in the first layer 155 and the green light quantum dot particles 158 in the second layer 157 may be arranged at a lower density than the red light quantum dot particles 122 of the first quantum dot converter 120 or the green light quantum dot particles 132 of the second quantum dot converter 130.

This is because a certain amount of blue light BL0 should pass through the first and second layers 155 and 157 and finally pass through the third quantum dot converter 150 without being absorbed by the red or green light quantum dot particles 156 or 158 in the third quantum dot converter 150.

Although the first layer 155 includes the red light quantum dot particles 156 and the second layer 157 includes the green light quantum dot particles 158 in an embodiment, the first layer 155 may include green light quantum dot particles 158 and the second layer 157 may include red light quantum dot particles 156 in other embodiments.

Red light RL converted by the red light quantum dot particles 156 arranged in the first layer 155 has smaller energy than green light GL, so that even if the red light RL is absorbed by the green light quantum dot particles 158 while passing through the second layer 157, electrical inversion does not occur, and thus the red light RL is not converted to the green light GL. Accordingly, a case where the blue light BL0 emitted from the light emitting layer 113 sequentially passes the first layer 155 in which the red light quantum dot particles 156 are arranged and the second layer 157 in which the green light quantum dot particles 158 are arranged has better efficiency than in the opposite case. However, apart from the consideration of efficiency, the green light quantum dot particles 158 may be arranged in the first layer 155 and the red light quantum dot particles 156 may be arranged in the second layer 157.

According to the disclosure, a display panel and display apparatus having the same may use a quantum dot converter to improve efficiency of an electroluminescent device, which enables the display apparatus to have more efficient display panel.

In addition, according to the above-described display panel and display apparatus, color reproduction performance of the display panel is improved, so that the display apparatus may output more appropriate color images.

The disclosure is not limited to the embodiments set forth herein, and it would be apparent to those skilled in the art that various changes and modifications may be made without departing from the idea of the disclosure. Thus, it should be understood that all changes and modifications are included in the technical scope of the disclosure as claimed in the claims of the disclosure.

What is claimed is:

1. A display panel comprising:
    a light emitting device;
    three quantum dot converters which include quantum dot particles, and are configured to convert light of a first color emitted from the light emitting device to light of different colors, respectively, and to emit the light of different colors, respectively;
    a transmission part configured to transmit the light of the first color emitted from the light emitting device; and
    a transparent substrate configured to transmit the light emitted from the three quantum dot converters and the transmission part,
    wherein one of the three quantum dot converters is further configured to emit a white light, among the light of different colors, to the transparent substrate,
    wherein the light emitting device comprises:
        a light emitting layer,
        a plurality of anodes which are separated from each other by a gap, respectively, and disposed on one side of the light emitting layer,
        a cathode disposed on other side of the light emitting layer and adapted to reflect light emitted from the light emitting layer toward the plurality of anodes,
    the three quantum dot converters are disposed to correspond to a first anode, a second anode, and a fourth anode, respectively, among the plurality of anodes, and
    the transmission part is disposed to correspond to a third anode among the plurality of anodes.

2. The display panel according to claim 1, wherein the three quantum dot converters and the transmission part form one pixel of the display panel,
    the transmission part is further configured to emit a blue light, and
    the three quantum dot converters comprise:
        a first quantum dot converter configured to emit a red light among the light of different colors,
        a second quantum dot converter configured to emit a green light among the light of different colors, and
        a third quantum dot converter which is the one of the three quantum dot converters that is configured to emit the white light.

3. The display panel according to claim 1, wherein the light of the first color comprises a blue light.

4. The display panel according to claim 2, wherein the first quantum dot converter comprises at least one red light-emitting quantum dot particle.

5. The display panel according to claim 2, wherein the second quantum dot converter comprises at least one green light-emitting quantum dot particle.

6. The display panel according to claim 1, wherein the transmission part comprises at least one scattering particle distributed within the transmission part and configured to scatter all or some of the light of the first color.

7. The display panel according to claim 2, wherein the third quantum dot converter comprises at least one yellow light-emitting quantum dot particle.

8. The display panel according to claim 7, wherein the white light emitted from the third quantum dot converter is a combination of a yellow light emitted from the at least one yellow light-emitting quantum dot particle and the blue light emitted from the light emitting device and transmitted through the third quantum dot converter.

9. The display panel according to claim 2, wherein the third quantum dot converter comprises at least one red light-emitting quantum dot particle and at least one green light-emitting quantum dot particle.

10. The display panel according to claim 2, wherein the third quantum dot converter comprises a first layer having at least one red light-emitting quantum dot particle and a second layer having at least one green light-emitting quantum dot particle.

11. The display panel according to claim 10, wherein the white light emitted from the third quantum dot converter is a combination of the red light emitted from the first layer, the green light emitted from the second layer, and the blue light emitted from the light emitting device and transmitted through the third quantum dot converter.

12. The display panel according to claim 4, further comprising a red color filter disposed between the first quantum dot converter and the transparent substrate and configured to transmit the red light.

13. The display panel according to claim 5, further comprising a green color filter disposed between the second quantum dot converter and the transparent substrate and configured to transmit the green light.

14. The display panel according to claim 6, further comprising a blue color filter disposed between the transmission part and the transparent substrate and configured to transmit a blue light.

15. The display panel according to claim 1, wherein the light emitting device further comprises:
    a hole transporting layer disposed between the plurality of anodes and the light emitting layer;
    an electron injection layer disposed between the cathode and the light emitting layer; and
    a planarization layer disposed between the transparent substrate and the plurality of anodes and configured to compensate for a difference in a level of the plurality of anode.

16. A display apparatus comprising:
    a light emitting device configured to emit a blue light;
    a driving circuit configured to drive the light emitting device;
    a transmission part configured to transmit the blue light emitted from the light emitting device and incident on the transmission part; and
    a first quantum dot converter, a second quantum dot converter, and a third quantum dot converter that include quantum dot particles, respectively, and configured to convert the blue light, which is emitted from the light emitting device and incident on the first quantum dot converter, the second quantum dot converter, and the third quantum dot converter, to light of different colors, respectively, and emit the light of different colors, respectively, wherein the third quantum dot converter includes at least one yellow light-emitting quantum dot particle, and is further configured to convert a portion of a totality of the blue light that is emitted from the light emitting device and incident on the third quantum dot converter, to a yellow light, among the light of different colors, and transmit a remaining portion of the totality of the blue light that is emitted from the light emitting device and incident on the third quantum dot converter, wherein the light emitting device comprises:
- a light emitting layer,
- a plurality of anodes which are separated from each other by a gap, respectively, and disposed on one side of the light emitting layer,
- a cathode disposed on other side of the light emitting layer and adapted to reflect light emitted from the light emitting layer toward the plurality of anodes,
- the first quantum dot converter, the second quantum dot converter, and the third quantum dot converter a pre disposed to correspond to a first anode, a second anode, and a fourth anode, respectively, among the plurality of anodes, and
- the transmission part is disposed to correspond to a third anode among the plurality of anodes.

17. The display apparatus according to claim 16, wherein light emitted from the third quantum dot converter is a white light including the yellow light converted by the third quantum dot converter and the blue light transmitted by the third quantum dot converter.

18. The display apparatus according to claim 17, wherein the first quantum dot converter comprises red light-emitting quantum dot particles and is further configured to convert the blue light, which is emitted from the light emitting device and incident on the first quantum dot converter, to a red light, among the light of different colors, via the red light-emitting quantum dot particles, and wherein the second quantum dot converter comprises green light-emitting quantum dot particles and is further configured to convert the blue light, which is emitted from the light emitting device and incident on the second quantum dot converter, to a green light, among the light of different colors, via the green light-emitting quantum dot particles.

19. The display apparatus according to claim 18, wherein the first quantum dot converter, the second quantum dot converter, the third quantum dot converter, and the transmission part form one pixel of the display apparatus, and wherein the driving circuit is further configured to independently drive the first quantum dot converter, the second quantum dot converter, the third quantum dot converter, and the transmission part so that, while the one pixel emits the white light, an amount of light emitted from the third quantum dot converter is greater than an amount of light emitted from the first quantum dot converter, the second quantum dot converter, and the transmission part.

20. A display apparatus comprising:
a light emitting device including a plurality of anodes and a cathode, and a light emitting layer provided between the plurality of anodes and the cathode and configured to generate a blue light;
a first quantum dot converter including red light-emitting quantum dot particles, and configured to convert the blue light, which is generated by the light emitting layer between a first anode of the plurality of anodes and the cathode and incident on the first quantum dot converter, to a red light;
a second quantum dot converter including green light-emitting quantum dot particles, and configured to convert the blue light, which is generated by the light emitting layer between a second anode of the plurality of anodes and the cathode and incident on the second quantum dot converter, to a green light;
a transmission part configured to transmit the blue light, which is generated by the light emitting layer between a third anode of the plurality of anodes and the cathode and incident on the transmission part; and
a third quantum dot converter configured to convert a portion of a totality of the blue light that is generated by the light emitting layer between a fourth anode of the plurality of anodes and the cathode and incident on the third quantum dot converter, to a yellow light, and to transmit a remaining portion of the totality of the blue light that is generated by the light emitting layer between the fourth anode of the plurality of anodes and the cathode and incident on the third quantum dot converter,
wherein the first quantum dot converter, the second quantum dot converter, the transmission part, the third quantum dot converter, and the transmission part form one pixel of the display apparatus, and
the first anode, the second anode, the third anode, and the fourth anode are separated from one another by a gap.

21. The display panel according to claim 1, further comprising:
a blocking matrix disposed to separate the three quantum dot converters from one another and from the transmission part,
wherein the blocking matrix is disposed to correspond to the gap.

* * * * *